(12) United States Patent
Lim

(10) Patent No.: US 7,425,466 B2
(45) Date of Patent: Sep. 16, 2008

(54) WIRE BONDING SYSTEM AND METHOD OF USE

(75) Inventor: Won-Chul Lim, Chungcheongnam-do (KR)

(73) Assignee: Samsung Electronics Co., Ltd, Suwon-si, Gyeonggi-do (KR)

( * ) Notice: Subject to any disclaimer, the term of this patent is extended or adjusted under 35 U.S.C. 154(b) by 17 days.

(21) Appl. No.: 11/679,730

(22) Filed: Feb. 27, 2007

(65) Prior Publication Data

US 2007/0141754 A1   Jun. 21, 2007

Related U.S. Application Data

(62) Division of application No. 11/100,642, filed on Apr. 6, 2005, now Pat. No. 7,199,465.

(30) Foreign Application Priority Data

Apr. 26, 2004   (KR) ................. 2004-28634

(51) Int. Cl.
*H01L 21/44* (2006.01)
(52) U.S. Cl. ............... 438/107; 438/106; 438/E23.051; 438/E33.075; 257/706; 257/678
(58) Field of Classification Search ......... 438/106–108; 257/678–706
See application file for complete search history.

(56) References Cited

U.S. PATENT DOCUMENTS 5,172,301 A   12/1992   Schneider

| | | |
|---|---|---|
| 5,444,296 A | 8/1995 | Kaul et al. |
| 5,739,586 A | 4/1998 | Cannizzaro et al. |
| 6,337,226 B1 | 1/2002 | Symons |
| 2007/0279873 A1* | 12/2007 | Mallik et al. ............... 361/719 |

FOREIGN PATENT DOCUMENTS

| | | |
|---|---|---|
| JP | 62-274755 | 11/1987 |
| JP | 63-222450 | 9/1988 |
| KR | 10-2001-0025874 | 4/2001 |
| KR | 2001-0055041 | 7/2001 |

OTHER PUBLICATIONS

English language abstract of Japanese Publication No. 62-274755.
English language abstract of Japanese Publication No. 63-222450.
English language abstract of Korean Publication No. 10-2001-0025874.
English language abstract of Korean Publication No. 2001-0055041.

* cited by examiner

*Primary Examiner*—Dung A. Le
(74) *Attorney, Agent, or Firm*—Narger Johnson & Johnson & McCollom, P.C.

(57) ABSTRACT

A semiconductor package wire bonding system and method of use are provided. The wire bonding system includes a heating block that heats and supports a printed circuit board on which a multi-layered semiconductor chip structure having an overhang is mounted. A support inserted through an opening in the printed circuit board supporting the overhang portion of the semiconductor chip structure is installed in a predetermined region of the heating block. Multiple supports on the heating block may support overhand portions on multiple semiconductor chip structures.

5 Claims, 5 Drawing Sheets

WIRE BONDING SYSTEM AND METHOD OF USE

This is a Divisional of U.S. patent application Ser. No. 11/100,642, filed on Apr. 6, 2005, now pending, which claims the benefit of Korean Patent Application No. 2004-0028634, filed on Apr. 26, 2004 in the Korean Intellectual Property Office, the disclosures of which are incorporated herein in their entirety by reference.

BACKGROUND OF THE INVENTION

1. Field of the Invention

The present invention relates to a wire bonding system and method of use, and more particularly, to a system for and a method of bonding a wire in a multi chip package having an overhang portion.

2. Description of the Related Art

The demand for miniature, thin, and light semiconductor packages has increased to manufacture small electronic devices. A semiconductor package typically includes one semiconductor chip. However, recently, a multi chip package (MCP) in which a number of chips having different functions are stacked in one package has been developed.

In a conventional MCP, a plurality of thin semiconductor chips having different sizes are stacked on each other so that wire bonding of the chips is performed.

When stacking the semiconductor chips for such the above wire bonding, an overhang portion may be formed as shown in FIG. 1.

More specifically, as shown in FIG. 1, in a conventional MCP, a first chip 20 is adhered to an upper side of a circuit board 15, and a second chip 30, larger than the first chip 20, is adhered to an upper side of the first chip 20. The first and second chips 20 and 30 are affixed by an adhesive layer 40 placed to expose a pad portion of the first chip 20. Since the second chip 30 is larger than the first chip 20, an overhang portion A that is not supported by the lower semiconductor chip 20 is formed.

Accordingly, the second chip 30 may bend, or in more serious cases, a crack may appear in the second chip 30 by the contact with a bonding capillary (not shown), when a wire is bonded between the second chip 30 and a printed circuit board (or the first chip 20).

When the chip 30 is thinner and the overhang portion A is longer, the bend or crack becomes more severe. Therefore, there is a need for a wire bonding system and method to avoid these problems.

SUMMARY OF THE INVENTION

A wire bonding system that prevents bending and cracking of an overhang portion in a multi-chip package (MCP) is provided. A wire bonding method for an MCP using the wire bonding system is also provided. The wire bonding system includes a heating block heating a printed circuit board with a semiconductor chip structure attached to the printed circuit board. The heating block includes a support supporting the semiconductor chip, the support being formed in a predetermined region of the heating block and passing through an opening in the printed circuit board. When the printed circuit board may include a plurality of semiconductor chip structures, the heating block may include a corresponding plurality of supports.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE PREFERRED EMBODIMENTS

Figure 1:
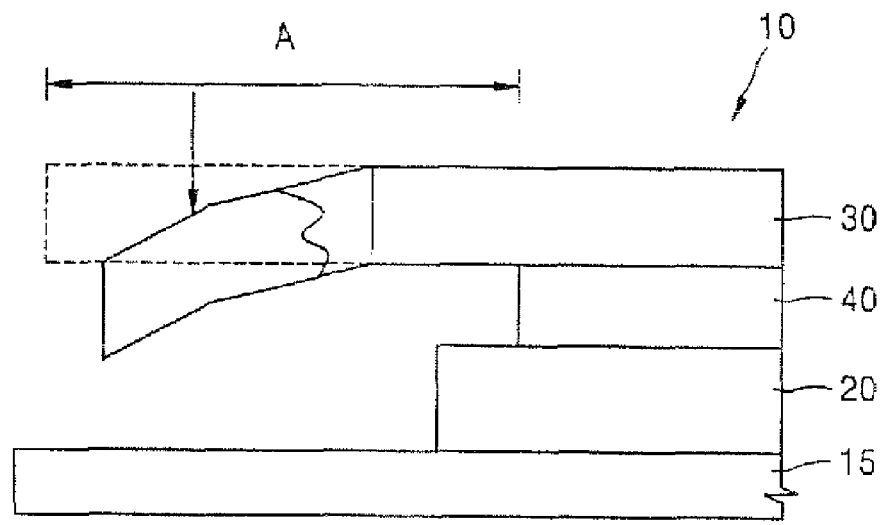
FIG. 1 is a cross-sectional view showing a conventional multi chip package (MCP) having an overhang portion.

The present invention will now be described more fully with reference to the accompanying drawings in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the shapes of the elements are exaggerated for clarity. Like reference numerals in the drawings denote like elements, and thus descriptions thereof will be presented only once.

An embodiment of the present invention is characterized in that an overhang portion of an upper semiconductor chip in a multi chip package (MCP) is supported during a wire bonding operation in order to prevent the overhang portion from bending or cracking.

In addition, the embodiment is further characterized by a heating block with a support in order to support the overhang portion during a wire bonding process to prevent the overhang portion from bending or cracking by the weight force of a bonding wire.

A wire bonding tool for an MCP having an overhang portion(s) will be described below.

Figure 2:
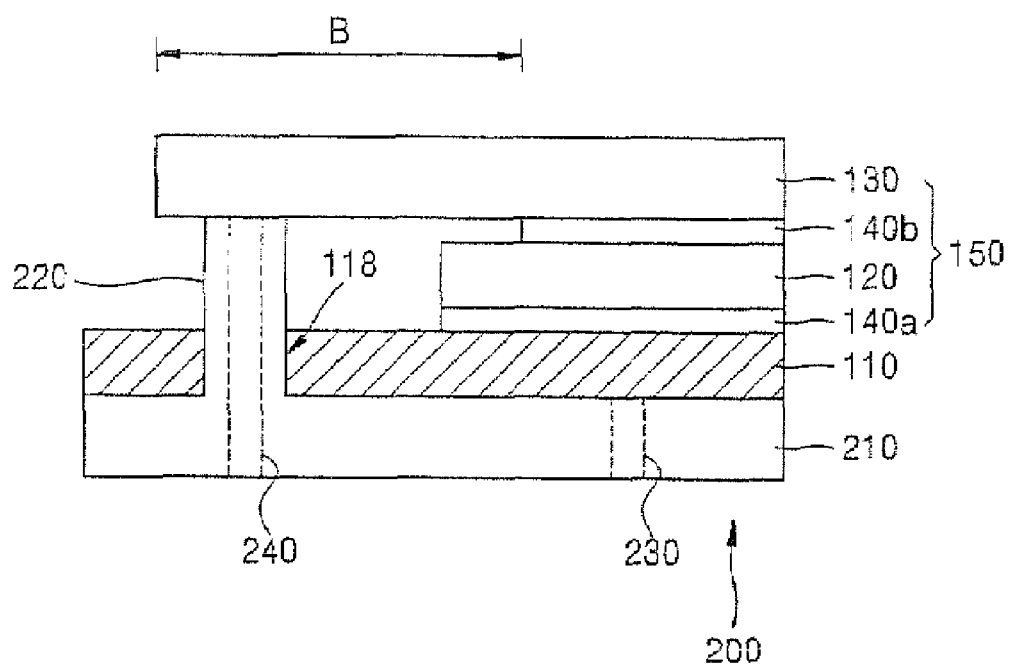
FIG. 2 is a cross-sectional view of an MCP mounted on a heating block according to an embodiment of the present invention.

Referring to FIG. 2, an MCP includes a printed circuit board 110 and a semiconductor chip structure 150 that is attached to the printed circuit board 110 and has an overhang portion. The semiconductor chip structure 150 includes a plurality of semiconductor chips having various sizes that are stacked on each other. More particularly, the semiconductor chip structure 150 includes a first chip 120 and a second chip 130 having different sizes. The first chip 120 is affixed to the printed circuit board 110 using a first adhesive layer 140a, and the second chip 130 that is larger than the first chip 120 is attached to the first chip 120 using a second adhesive layer 140b. Because the second chip 130 is larger than the first chip 120, there is an overhang portion B that is not supported by any other members of the MCP.

Figure 3:
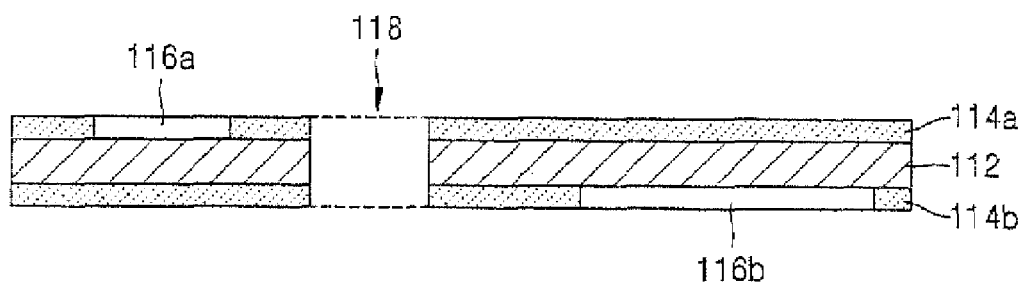
FIG. 3 is a cross-sectional view of a printed circuit board of an MCP according to an embodiment of the present invention.

As shown in FIG. 3, a printed circuit board 110 includes a conductive circuit layer 112 and insulating layers 114a and 114b which are placed on top and lower surfaces of the conductive layer 112. A bond finger 116a to be electrically connected to bonding pad(s) of the first chip 120 and/or the second chip 130 is formed on an upper side of the insulating layer 114a, and a solder-ball pad 116b to be electrically connected to the bond finger 116a is formed on the bottom surface of the lower insulating layer 114b. Here, the bond finger 116a is properly connected to the solder ball pad 116b by the conductive circuit layer 112.

The printed circuit board 110 according to an embodiment of the present invention has a plurality of holes 118 or a slit formed in a predetermined region. A member supporting an overhang portion B of the second chip 130 is inserted and affixed in the holes 118 (the overhang portion B will be described below). A plurality of holes 118 are formed to correspond to the overhang portions placed on the printed circuit board 110.

As is well known, a plurality of semiconductor chip structures (in the embodiment of the present invention, the stacked semiconductor chips) are arrayed on a single printed circuit board (PCB) of a chip scale package (CSP), such as a BGA package. Accordingly, a plurality of a semiconductor chip structures are arrayed in a predetermined shape, such as a matrix shape, on the printed circuit board 110, and the holes 118 (or the slit) also may be formed in, for example, a matrix shape to correspond to the overhang portion B of each of the semiconductor chip structures 150.

Figure 4:
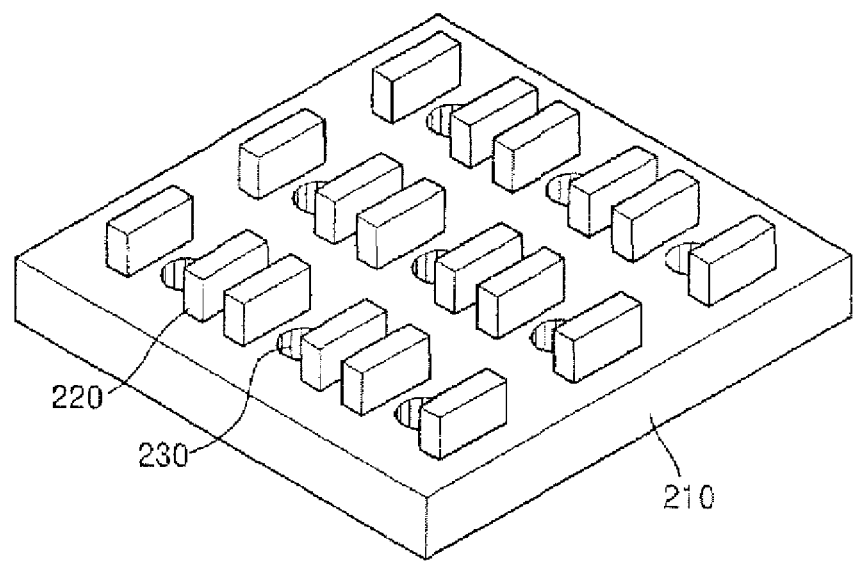
FIG. 4 is a perspective view of a heating block according to an embodiment of the present invention.

On the other hand, a wire bonding system for an MCP as shown in FIG. 2 includes a heating block 210. The heating block 210 fastens and supports a printed circuit board 110 during wire bonding, and makes the wire bonding easier by applying heat to semiconductor chips 120 and 130. As shown in FIGS. 2 and 4, the heating block 210 according to an aspect of the present invention includes a support 220 for supporting a portion of a semiconductor chip, for example, an overhang portion of the second chip 130, the support passing through a hole 118 (or a slit) in the printed circuit board 110. Here, since a plurality of semiconductor chip structures 150 are arrayed in a matrix shape on the printed circuit board 110 as describe above, the support 220 may also be formed in a matrix shape to support an overhang portion B of the semiconductor chip structure 150.

Figure 5:
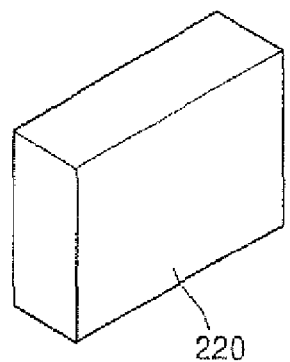
FIGS. 5 through 8 are diagrams showing exemplary supports according to embodiments of the present invention.

Further, the support 220 may be formed as a square pillar shape, for example, a rectangular parallelepiped as shown in FIG. 5. The support 220 fully sustains one side of the second chip 130, which overhangs, and the hole 118 in the printed circuit board 110 may be shaped to correspond to the square shaped support 220.

Figure 6:
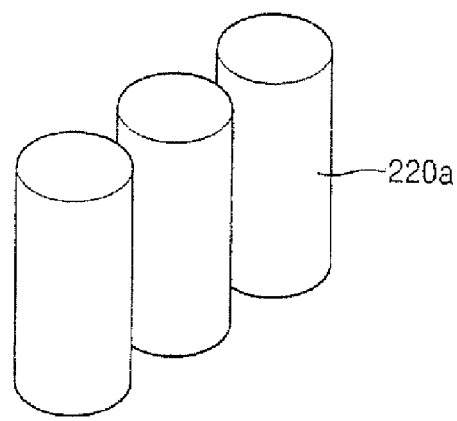

In addition, as shown in FIG. 6, a support 220a may be formed in a cylindrical shape. In this case, a hole on a printed circuit board 110 also may be shaped to correspond to the cylindrical shaped support 220a.

In the meantime, as shown in FIGS. 2 and 4, a main vacuum line 230 is installed inside the heating block 210 to produce a vacuum in a back side of the printed circuit board 110. At least one main vacuum line 230 is installed to correspond to the semiconductor chip structure 150. As a result, semiconductor chips can be easily affixed to the printed circuit board 110 due to the vacuum produced in the back side of the printed circuit board 110.

Figure 7:
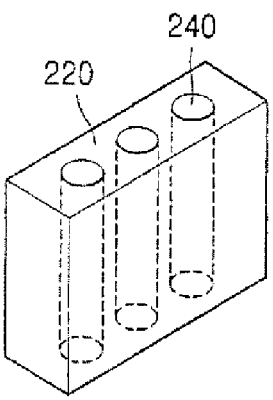
Figure 8:
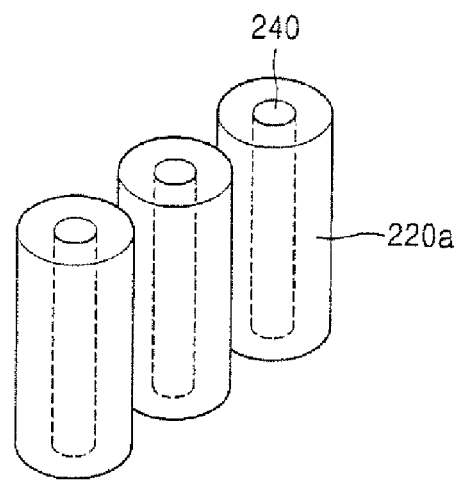

Moreover, as shown in FIGS. 7 and 8, an auxiliary vacuum line 240 may be additionally formed inside the support 220 or 220a to produce a vacuum corresponding to the overhang portion B of the second chip 130.

Referring to FIGS. 9A through 9D, a wire bonding method according to an embodiment of the present invention will be described below.

Figure 9A:
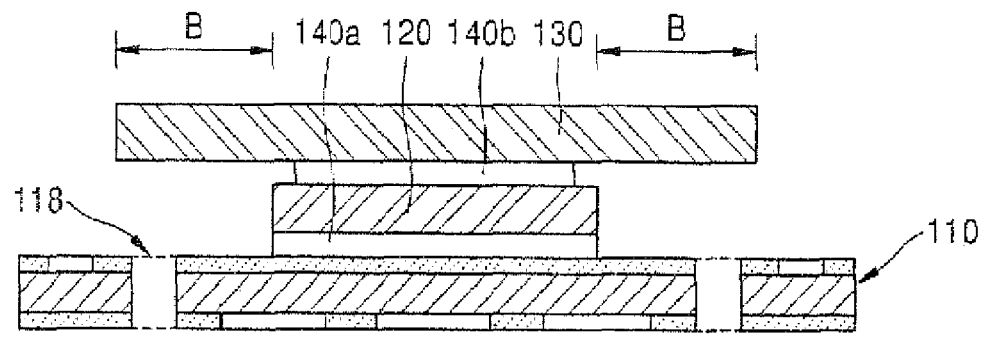
FIGS. 9A through 9D are sectional views for explaining a wire bonding method for an MCP according to an embodiment of the present invention.

As shown in FIG. 9A, a first chip 120 is attached to a printed circuit board 110 by a first adhesive layer 140a. Then, a second chip 130, which is larger than the first chip 120, is attached to the first chip 120 using a second adhesive layer 140b. Holes 118 are formed in a region of the printed circuit board 110 corresponding to each of the overhang portions B of the second chip 130.

Figure 9B:
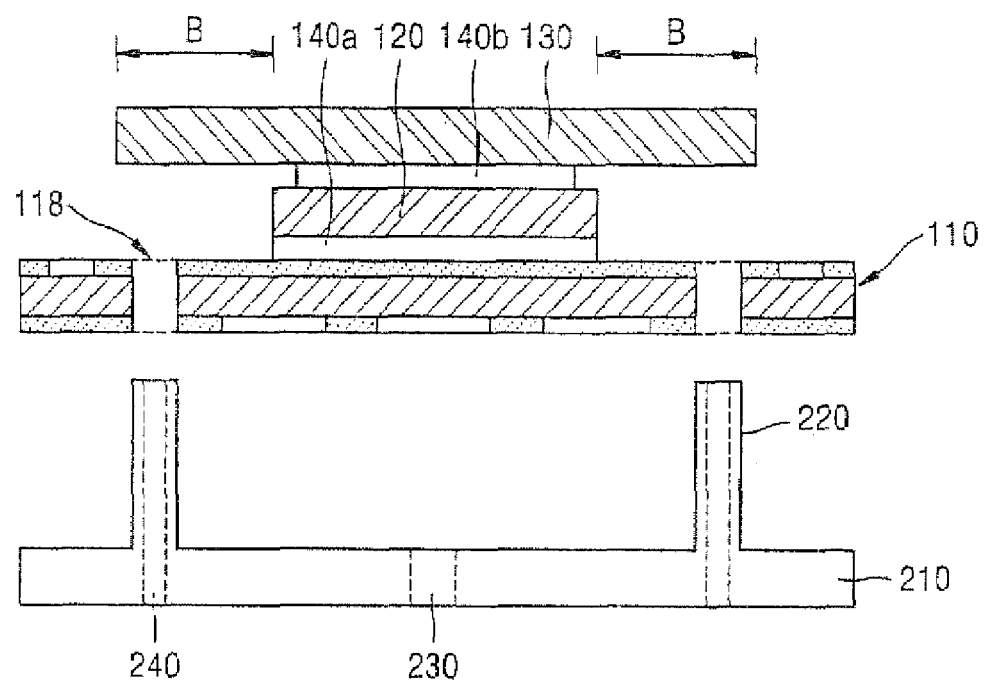

Referring to FIG. 9B, a heating block 210 of a wire bonding tool is disposed on a bottom area of the printed circuit board 110. The heating block 210 is aligned with each hole 118 and each support 220 of the heating block 210.

Figure 9C:
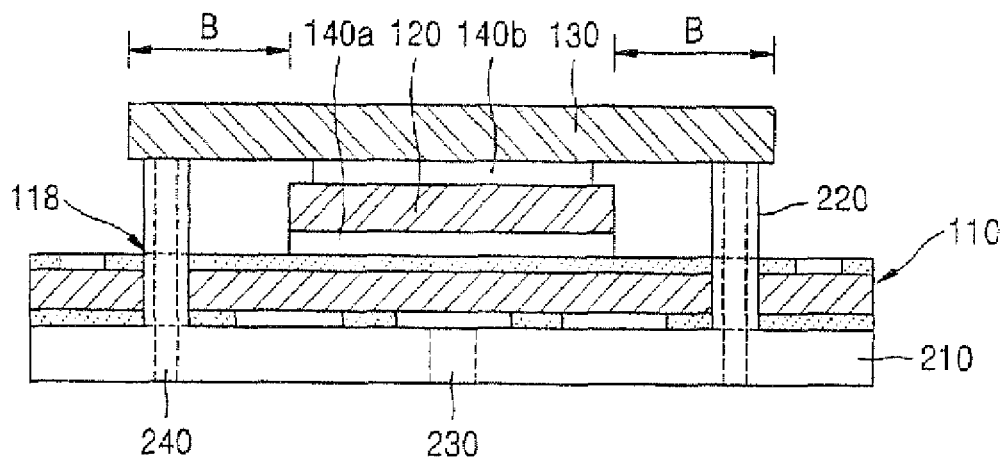

Thereafter, as shown in FIG. 9C, the support 220 of the heating block 210 is inserted into the hole 118 and affixed therein so that the overhang portion B of the second chip 230 is supported. Further, a vacuum is produced corresponding to the printed circuit board 110 and the overhang portions B of the second chip 130 by vacuum lines 230 and 240.

Figure 9D:
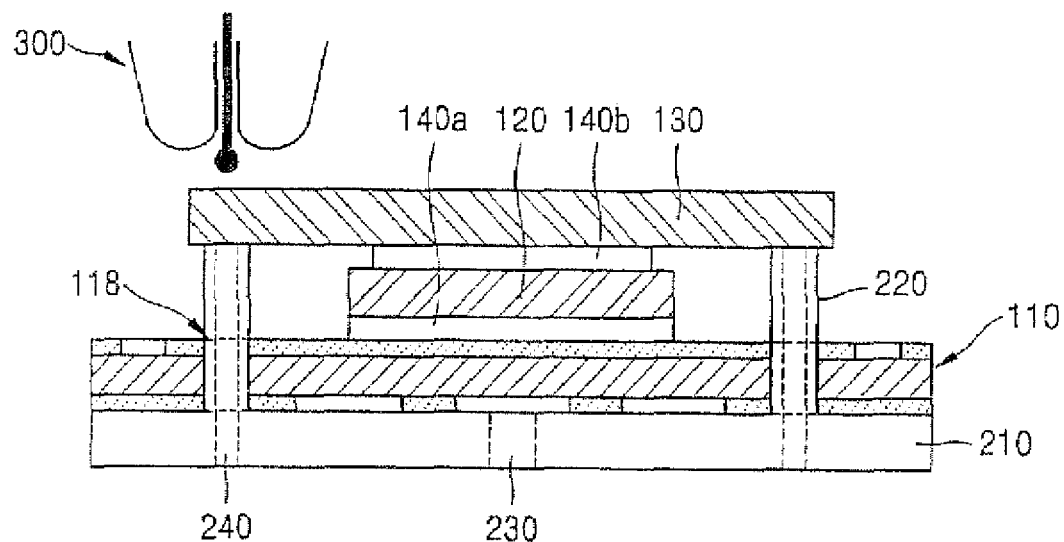

Subsequently, as shown in FIG. 9D, the wire bonding between the printed circuit board 110 and the second chip 130 fastened by the support 220 is performed by means of a capillary 300. Here, even if a weight force of the capillary 300 used for wire bonding is applied to the overhang portions B of the second chip 130, bending or cracking of the overhang portions B of the second chip 130 is prevented because the overhang portions B are supported by the support 220.

As described above, according to an embodiment of the present invention, a support is installed on a heating block of a wire bonding tool to support an overhang portion of an MCP. Accordingly, the overhang portion of the MCP is held by the support of the heating block, thereby preventing the overhang portion of the MCP from bending or cracking by the weight force of a bonding capillary.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of wire bonding, comprising:
attaching a multi-layered semiconductor chip structure having an overhang portion to a printed circuit board;
aligning a heating block on a bottom area of the printed circuit board including aligning a support on the heating block to match the overhang portion of the semiconductor chip structure;
inserting the support on the heating block through an opening in the printed circuit board;
supporting the overhang portion of the semiconductor chip structure with the inserted support; and
wire bonding the semiconductor chip structure and the printed circuit board.

2. The method of claim 1, wherein attaching the multi-layered semiconductor chip structure to the printed circuit board includes:
attaching a first chip to the printed circuit board; and
attaching a second larger chip to the first chip.

3. The method of claim 1, wherein attaching the multi-layered semiconductor chip structure to the printed circuit board includes attaching a plurality of multi-layered semiconductor chip structures to the printed circuit board, each multi-layered semiconductor chip structure having an overhang portion;
aligning a support on the heating block to match the overhang portion of the semiconductor chip structure includes aligning a plurality of supports on the heating block to match the overhang portion of each semiconductor chip structure;

inserting the support on the heating block through an opening in the printed circuit board includes inserting the plurality of supports on the heating block through a corresponding plurality of openings in the printed circuit board; and supporting the overhang portion of the semiconductor chip structure with the inserted support includes supporting the overhang portion of each of the plurality semiconductor chip structures with a corresponding inserted one of the plurality of supports.

4. The method of claim 1, further comprising applying a vacuum pressure from a vacuum line in the heating block to the bottom area of the printed circuit board.

5. The method of claim 4, further comprising applying a vacuum pressure from a vacuum line in the support to the overhang portion of the semiconductor chip structure.

* * * * *